United States Patent
Kim et al.

(10) Patent No.: US 11,322,190 B2
(45) Date of Patent: May 3, 2022

(54) MAGNETIC DEVICE INCLUDING SPIN SINKER

(71) Applicant: KOREA INSTITUTE OF SCIENCE AND TECHNOLOGY, Seoul (KR)

(72) Inventors: Kyoung Whan Kim, Seoul (KR); Dong Soo Han, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/127,414

(22) Filed: Dec. 18, 2020

(65) Prior Publication Data

US 2022/0036933 A1 Feb. 3, 2022

(30) Foreign Application Priority Data

Jul. 30, 2020 (KR) .................. KR10-2020-0094875

(51) Int. Cl.
| | |
|---|---|
| *G11C 11/16* | (2006.01) |
| *H01L 27/22* | (2006.01) |
| *H01L 43/04* | (2006.01) |
| *H01L 43/06* | (2006.01) |
| *H01L 43/10* | (2006.01) |
| *G11C 11/18* | (2006.01) |

(52) U.S. Cl.
CPC ........ *G11C 11/161* (2013.01); *G11C 11/1673* (2013.01); *G11C 11/1675* (2013.01); *G11C 11/18* (2013.01); *H01L 27/222* (2013.01); *H01L 43/04* (2013.01); *H01L 43/06* (2013.01); *H01L 43/10* (2013.01)

(58) Field of Classification Search
None
See application file for complete search history.

(56) References Cited

U.S. PATENT DOCUMENTS

2017/0178705 A1* 6/2017 Buhrman ............ G11C 11/1673

* cited by examiner

*Primary Examiner* — James G Norman
(74) *Attorney, Agent, or Firm* — Marshall, Gerstein & Borun LLP

(57) ABSTRACT

Disclosed is a magnetic device including a spin sinker. The magnetic device includes a storage medium, a spin sinker, and a read node. The storage medium receives an in-plane current from outside and generates a self-generated spin current that perpendicularly flows to a charge current, thereby controlling a data structure with the self-generated spin current. The spin sinker receives and attenuates the spin current. The read node measures a magnetoresistance of a data structure through the storage medium. The storage medium is made of a magnetic metal and the spin sinker is made of a magnetic insulating material.

22 Claims, 11 Drawing Sheets

MAGNETIC DEVICE INCLUDING SPIN SINKER

STATEMENT OF GOVERNMENTAL SUPPORT

This invention was made with government support under Project No. 2020R1C1C1012664 awarded by Young Researcher Program through the National Research Foundation (NRF) funded by the Ministry of Science and ICT (MSIT) at a contribution rate 80/100, Project No. CAP-16-01-KIST awarded by Creative Allied Project (CAP) through the National Research Council of Science & Technology (NST) funded by MSIT at a contribution rate 10/100, Project No. 2019M3F3A1A02071509 awarded by the National Research and Development Program through NRF funded by MSIT at a contribution rate 5/100, and Project No. 2E30600 awarded by the Korea Institute of Science and Technology Institutional Program at a contribution rate 5/100. The supervising institute was the Korea Institute of Science and Technology.

CROSS REFERENCE TO RELATED APPLICATION

The present application claims priority to Korean Patent Application No. 10-2020-0094875, filed Jul. 30, 2020, the entire contents of which is incorporated herein for all purposes by this reference.

BACKGROUND OF THE INVENTION

Field of the Invention

The present invention relates to a magnetic device including a magnetic layer and a spin sinker that are sequentially stacked, in which an in-plane current is directly supplied to the magnetic layer and is used to control the movement of a data structure in the magnetic layer.

Description of the Related Art

Recently, in order to compensate for the shortcomings of hard disk drives used in computers, a racetrack device has emerged as an alternative to the hard disk drive. Here, the racetrack device is configured to move a magnetic structure through a magnetic wire that is fixed and which works like a circular disk of a hard disk drive.

Examples of the magnetic structure include a magnetic domain wall (refer to Patent Documents 1 and 2) and a magnetic skyrmion (refer to Patent Document 3). The racetrack device is accessed from the outside to detect the magnetic structure, and the magnetic structure is read as data. The racetrack device is drawing attention as a nonvolatile memory that can continuously retain data stored in a magnetic wire even without being supplied with power from the outside.

The racetrack device operates in such a manner that it receives an in-plane current (or charge current) from the outside and generates a spin transfer torque or a spin obit torque that controls the position of a magnetic structure. FIG. 1 illustrates a racetrack device 20 based on spin transfer torque (hereinafter, referred to as "spin transfer torque device").

The spin transfer torque device 20 stores information through magnetic domains 3 and 9 existing in a magnetic layer 10 and has a magnetic domain wall 6 between the two magnetic domains 3 and 9. The two magnetic domains 3 and 9 have a continuous magnetization facing each other (not shown in the drawing), and the magnetic domain wall 6 connects the two magnetic domains 3 and 9 to each other and has spatially inhomogeneous magnetization direction.

When an in-plane current 34 is supplied to the magnetic layer 10 in an X direction, the in-plane current 34 generates a spin-polarized current 38 along the X direction in the magnetic layer, and the spin-polarized current 38 applies a spin transfer torque to the magnetic domain wall 6 in a direction opposite to the direction in which the spins of electrons change according to the law of angular momentum conservation. The spin transfer torque moves the magnetic domain wall 6 in the X direction, and thus information stored as a magnetic domain is also moved.

FIG. 2 illustrates a racetrack device 70 based on spin orbit torque (hereinafter, referred to as "spin orbit torque device"). The spin orbit torque device 70 includes a magnetic layer 50 and a heavy metal layer 60 that are sequentially stacked. When an in-plane current 83 is supplied to the heavy metal layer 60 in an X direction, conduction electrons in the heavy metal layer 60 generate a spin current 86 toward the magnetic layer 50, thereby applying a spin orbit torque to the magnetic moments in the magnetic layer 50.

That is, the in-plane current 83 flowing through the heavy metal layer 60 is influenced by the spin orbit interaction of the heavy metal layer 60, thereby showing a different flow trajectory of conduction electrons depending on the spin direction of the conduction electrons. Thus, a spin current 86 or a spin Hall current is generated in the heavy metal layer 60.

Here, the spin orbit interaction causes the accumulation of conduction electrons having opposite spin directions at both edges of the heavy metal layer 60 to form a spin potential difference between the edges of the heavy metal layer 60. The spin potential difference causes the spin current 86 to flow from a positive spin density formed at one edge of the heavy metal layer 60 toward a negative spin density formed at the other edge of the heavy metal layer 60.

This phenomenon is also referred to as "spin Hall effect" because it is similar to the conventional Hall effect. The spin current 86 is transferred to the magnetic layer 50 and interacts with magnetic moments in the magnetic layer 50, thereby generating a torque referred to as a spin orbit torque.

The spin orbit torque moves the magnetic skyrmion 89 formed at the interface between the magnetic layer 50 and the heavy metal layer 60 in the X direction or the Y direction. Accordingly, the position of the magnetic skyrmion 89 is controlled by the intensity, direction, or time of the current applied from the outside of the magnetic layer 50.

A similar structure to the spin orbit torque device 70 is disclosed in Korean Patent Registration Publication 101844128. Here, the spin orbit torque device 70 has a characteristic of transferring the magnetic structure 89 through the magnetic layer 50 at a speed of several tens to hundreds of times that of the spin transfer torque device 20 at the current density within the same range (refer to Nanotechnology 29, 175404 (2019)).

However, the operation of the spin orbit torque device 70 is closely related to the efficient injection of the spin current 86 from the heavy metal layer 60 to the magnetic layer 50, the precise control of interfacial properties between the magnetic layer 50 and the heavy metal layer 60, and optimization of the material of the heavy metal layer 60 providing a spin current channel.

Accordingly, the practical use of the spin orbit torque device 70 faced difficulties due to the limitation of material control of the magnetic layer 50 and the heavy metal layer 60. In addition, in the spin orbit torque device 70, an increase in the thickness of the magnetic layer 50 is advantageous in terms of thermal stability of magnetization information of the magnetic structure 89, while it is disadvantageous in terms of device optimization because it reduces the efficiency of the spin torque 86 in the magnetic layer 50.

Accordingly, the spin orbit torque device 70 needs to employ a technology that can effectively generate a spin current and improve thermal stability of magnetism information in order to realize a faster operation than the spin transfer torque device 20 while being freed from the dependency on the spin current 86 of the heavy metal layer 60.

SUMMARY OF THE INVENTION

The present invention has been devised to solve the problems occurring in the related art, and an objective of the present invention is to provide a magnetic device including a spin sinker, the magnetic device being capable of effectively generating a spin current and improving thermal stability of magnetism information, thereby providing faster operation characteristics than a spin transfer torque device while maintaining a similar structure to a spin orbit torque device (racetrack device based on spin orbit torque) but eliminating dependency on a spin current of a heavy metal layer.

In order to accomplish the objective of the present invention, one aspect of the present invention provides a magnetic device including a spin sinker, the magnetic device including: a storage medium that receives an in-plane current from outside, generates a self-generated spin current that perpendicularly flows to a charge current that is the in-plane current, and controls a data structure using the self-generated spin current; a spin sinker that receives and attenuates the self-generated spin current from the storage medium and transfers the attenuated spin current; and a read node that measures a magnetoresistance of the data structure through the storage medium, in which the storage medium is made of a magnetic metal, and the read node reads data as "1" or "0" according to a presence type of the data structure in the storage medium or according to presence or absence of the data structure in the storage medium.

The spin sinker may be disposed on the storage medium in a manner to be in direct contact with the storage medium, and the read node may be disposed under the storage medium in a manner to be in direct contact with the storage medium.

The storage medium may be composed of a single layer made of a ferromagnetic metal, a ferrimagnetic metal, or an antiferromagnetic metal, and the spin sinker may be composed of a single layer made of a ferromagnetic insulating material, a ferrimagnetic insulating material, or an antiferromagnetic insulating material.

The storage medium may be composed of a plurality of layers each of which is made of a ferromagnetic metal, a ferrimagnetic metal, or an antiferromagnetic metal, and the spin sinker may be composed of one layer made of a ferromagnetic insulating material, a ferrimagnetic insulating material, or an antiferromagnetic insulating material.

The storage medium may be composed of a single layer made of a ferromagnetic metal, a ferrimagnetic metal, or an antiferromagnetic metal, and the spin sinker may be composed of a plurality of layers each of which is made of a ferromagnetic insulating material, a ferrimagnetic insulating material, or an antiferromagnetic insulating material.

The storage medium may be composed of a plurality of layers each of which is made of a ferromagnetic metal, a ferrimagnetic metal, or an antiferromagnetic metal, and the spin sinker may be composed of a plurality of layers each of which is made of a ferromagnetic insulating material, a ferrimagnetic insulating material, or an antiferromagnetic insulating material.

The storage medium may include at least one of Fe, Co, Ni, B, Si, Zr, Pt, Tb, Pd, Cu, W, Ta, Gd, Ir, Mn, Cr, I, Ge, and Te, and the spin sinker may include at least one of Fe, Co, Ni, Mn, Y, Tm, Gd, Eu, S, N, O, Ba, Cr, Ge, and Te.

The magnetic device may further include a write node disposed at a first side of the storage medium and under the spin sinker in a manner to be in electrical contact with the storage medium, and the write node may receive external power from the outside of the storage medium and supply the in-plane current to the storage medium.

The read node may include a tunnel barrier and a ferromagnetic layer sequentially stacked on the storage medium and may electrically measure a magnetoresistance corresponding to data "1" or data "0" during movement of the data structure in the storage medium.

The data structure may include a magnetic domain wall, a magnetic vortex, a magnetic skyrmion, or a magnetic skyrmion derivative structure, and the magnetic skyrmion derivative structure may include a magnetic skyrmionium or a magnetic hopfion.

The magnetic device may further include an electrical insulator provided around the storage medium and the spin sinker when the spin sinker is stacked on the storage medium. The storage medium and the spin sinker may constitute a stack unit, and multiple stack units may be stacked, in which the electrical insulator is disposed between a lower stack unit and an upper stack unit of the stack units adjacent to each other. In this structure, the electrical insulator may be in direct contact with the spin sinker of the lower stack unit and the storage medium of the upper stack unit, and thus a flow of a self-generated spin current from the spin sinker of the lower stack unit to the storage medium of the upper stack unit is prevented.

Each of the storage medium and the spin sinker may include at least one layer, and may include the same number of layers.

Each of the storage medium and the spin sinker may include at least one layer, and may include different numbers of layers.

The storage medium may be made of a ferromagnetic metal, a ferrimagnetic metal, or an antiferromagnetic metal, including at least one of Fe, Co, Ni, B, Si, Zr, Pt, Tb, Pd, Cu, W, Ta, Gd, Ir, Mn, Cr, I, Ge, and Te, and the spin sinker may be made of a ferromagnetic insulating material, a ferrimagnetic insulating material, or an antiferromagnetic insulating material, including at least one of Fe, Co, Ni, Mn, Y, Tm, Gd, Eu, S, N, O, Ba, Cr, Ge, and Te.

The magnetic device may further include: a write node positioned around the storage medium; a write selection circuit electrically connected to the write node; and a read selection circuit electrically connected to the read node. The write node and the read node may be electrically connected to the storage medium of each of the stack units. Each of the nodes may include a switching circuit so that each of the switching circuits may be individually turned on and off when a read operation or a write operation is performed on the storage medium of each of the stack units.

The write node may supply the in-plane current to the storage medium of each of the stack units. The read node may include a tunnel barrier and a ferromagnetic layer disposed around the storage medium of each of the stack units and may electrically measure a magneto resistance corresponding to data "1" or data "0" from the storage medium during movement of the data structure in the storage medium.

The write selection circuit and the read selection circuit may select the write node for each of the stack units and the read node for each of the stack units and may supply power to the write node for each of the stack units and the read node for each of the stack units.

The data structure may include a magnetic domain wall, a magnetic vortex, a magnetic skyrmion, or a magnetic skyrmion derivative structure, and the magnetic skyrmion derivative structure may include a magnetic skyrmionium or a magnetic hopfion.

The magnetic device may further include a tunnel barrier and a ferromagnetic layer positioned on the spin sinker when the storage media and the spin sinkers are sequentially and alternately stacked. The read node may include a lower read node disposed under the storage medium and an upper read node disposed on the ferromagnetic layer, thereby being in direct contact with the storage medium and the ferromagnetic layer. The read node may have the storage medium and the ferromagnetic layer disposed between the upper read node and the lower read node, the spin sinker, and the tunnel barrier as a memory cell, in which the ferromagnetic layer has fixed magnetization and the storage medium may have free magnetization.

The magnetic device may further include a write node electrically connected to the storage medium. The write node may apply power to the storage medium, thereby supplying the in-plane current to the storage medium. The read node may electrically measure a magnetoresistance corresponding to the data "1" or the data "0" in the storage medium disposed between the lower read node and the upper read node according to whether a magnetization direction of the storage medium and a magnetization direction of the ferromagnetic layer are parallel to each other or anti-parallel to each other.

The storage medium may be made of a ferromagnetic metal, a ferrimagnetic metal, or an antiferromagnetic metal, including at least one of Fe, Co, Ni, B, Si, Zr, Pt, Tb, Pd, Cu, W, Ta, Gd, Ir, Mn, Cr, I, Ge, and Te, and the spin sinker may be made of a ferromagnetic insulating material, a ferrimagnetic insulating material, or an antiferromagnetic insulating material, including at least one of Fe, Co, Ni, Mn, Y, Tm, Gd, Eu, S, N, O, Ba, Cr, Ge, and Te.

The data structure may be the magnetization direction of the storage medium, which is parallel to or anti-parallel to the magnetization direction of the ferromagnetic layer.

The present invention provides a magnetic device in which a magnetic layer and a spin sinker are sequentially stacked. The magnetic device controls the position of the data structure formed at the interface between the magnetic layer and the spin sinker using a self-generated spin current that is generated by the spin-orbit interaction of the magnetic layer. Therefore, the magnetic device according to the present invention can achieve a faster operation than a spin transfer torque device while having a stricture similar to a conventional spin orbit torque device which is a racetrack device based on spin orbit torque.

According to the present invention, in order to realize a structure in which the magnetic layer and the spin sinker are sequentially stacked, the magnetic layer includes a ferromagnetic metal, a ferrimagnetic metal, or an anti-ferromagnetic metal, and the spin sinker includes a ferromagnetic insulating material, a ferrimagnetic insulating material, a ferrimagnetic insulating material, and an anti-ferromagnetic insulating material. Since the structure is more easily optimized than the interface between a magnet and a heavy metal in a conventional spin orbit torque device, the structure of the present invention can be free from dependence on the spin current of the heavy metal although maintaining a structure similar to a conventional racetrack device based on spin orbit torque.

The magnetic device according to the present invention is composed of the magnetic layer and the spin sinker that are sequentially stacked. The magnetic device directly generates a spin current in the magnetic layer thereof rather than receiving it from outside, and reduces spin losses at the interface between the magnetic layer and the spin sinker during the flow of the spin current from the magnetic layer toward the spin sinker by using a magnetic material for the magnetic layer and the spin sinker. In addition, since the spin sinker attenuates the spin current, it is possible to minimize power loss for operation of the magnetic structure and to efficiently generate the spin current while maintaining a structure similar to a conventional spin-orbit torque-based racetrack device.

A conventional spin-orbit torque-based racetrack device is required to increase the thickness of a magnetic layer to ensure thermal stability of magnetic information on a data structure. However, the increased thickness of the magnetic layer has a problem of reducing the efficiency of a spin torque in the magnetic layer. However, in the case of the present invention providing the magnetic device composed of the magnetic layer and the spin sinker that are sequentially stacked, it is possible to increase the self-generated spin current in the magnetic layer by increasing the thickness of the magnetic layer. Therefore, the magnetic device according to the present invention exhibits improved thermal stability of magnetic information at the same spin torque as a conventional spin-orbit torque-based racetrack device.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the accompanying drawings so that those skilled in the art can easily implement the present invention.

Figure 3:
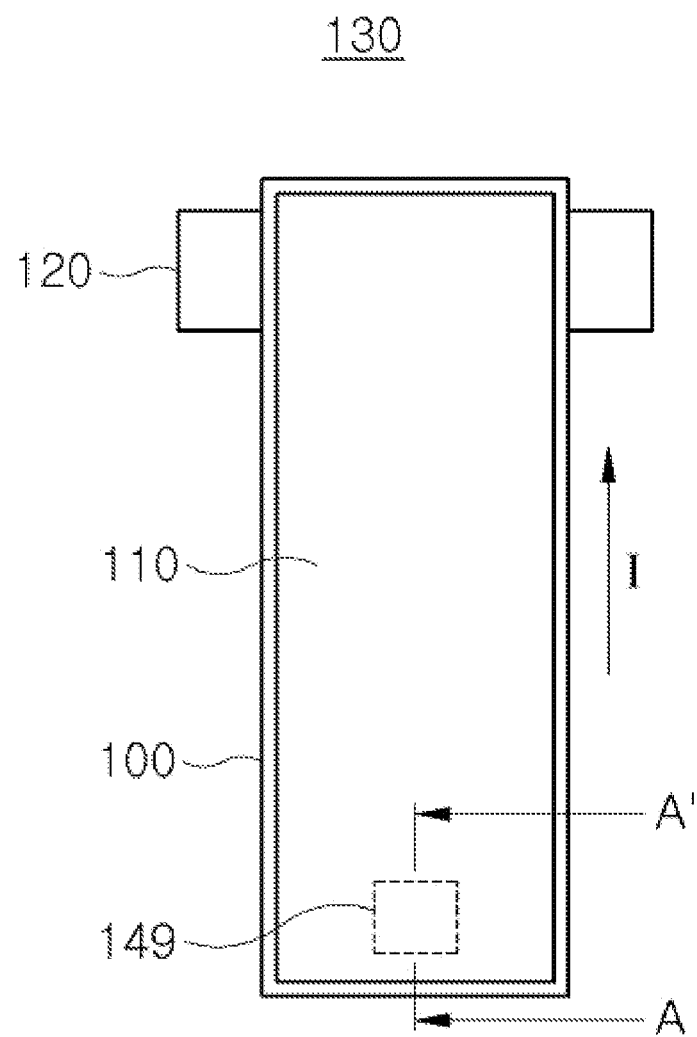
FIG. 3 is a plan view schematically illustrating a magnetic device including a spin sinker, according to a first embodiment of the present invention.
Figure 4:
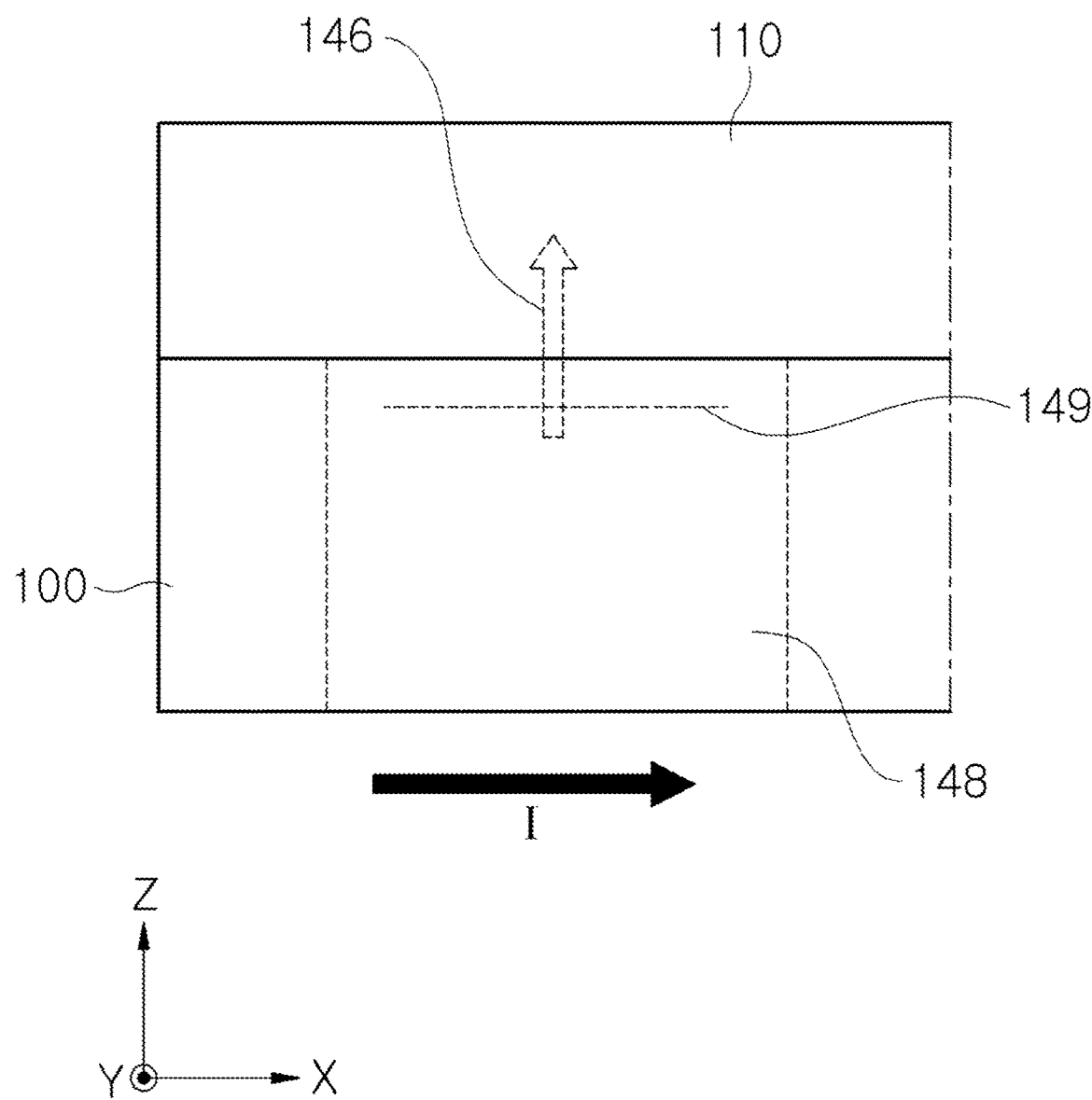
FIG. 4 is a cross-sectional view taken along line A-A' of FIG. 3.

FIG. 3 is a plan view schematically illustrating a magnetic device including a spin sinker, according to a first embodiment of the present invention, and FIG. 4 is a cross-sectional view taken along line A-A' of FIG. 3.

The magnetic device including a spin sinker forms a data structure in a magnetic layer. The data structure may be a magnetic domain or a magnetic (or spin) structure in the magnetic layer.

Referring to FIGS. 3 to 4, according to the first embodiment of the present invention, a magnetic device 130 includes a storage medium 100, a spin sinker 110, and a read node 120.

The storage medium 100 receives an in-plane current I that flows in an X direction from the outside, generates a self-generated spin current 146 that flows in a Z direction perpendicular to the X direction in which a charge current, i.e., the in-plane current, flows. The storage medium 100 controls a data structure 148 or 149 with the self-generated spin current 146.

That is, the storage medium 100 controls information ("1" or "0" described below) contained in the data structure 148 or 149. The spin sinker 110 receives and attenuates the spin current 146 from the storage medium 100, and transmits the attenuated spin current 146. The read node 120 measures the magnetoresistance of the data structure 148 or 149 through the storage medium 100. The storage medium 100 is made of a magnetic metal, and the spin sinker 100 is made of a magnetic insulating material that does not allow transmission of the charge current I therethrough.

The read node 120 reads data "1" or data "0" according to the type of presence of the data structure 148 or 149 in the storage medium 100 or according to the presence or absence of the data structure in the storage medium 100. In more detail, when the in-plane current I is supplied to the magnetic layer 100 in the X direction, the magnetic layer 100 generates the self-generating spin current 146 that flows from the magnetic layer 100 to the spin sinker 110 along the Z direction due to the spin orbit interaction depending on the spin direction of conduction electrons.

When the self-generated spin current 146 flows in the Z direction from the magnetic layer 100 to the spin sinker 110, the self-generated spin current 146 is attenuated by the spin sinker 110. The self-generated spin current 146 attenuated by the spin sinker 110 generates a spin torque exerted on the magnetic domain wall 148 or the magnetic skyrmion 149 that serves as the data structure 149 in the magnetic layer 100, thereby controlling the position of the magnetic domain wall 148 or the magnetic skyrmion 149 along the X direction. Accordingly, the type of presence of the data structure 148 refers to a direction of magnetization of at least one of a magnetic domain illustrated in FIG. 9 and a magnetic domain wall. The presence or absence of the data structure 149 refers to the presence or absence of a magnetic domain wall or a magnetic skyrmion.

The spin sinker 110 is positioned at one side (referred to as first side) of the storage medium 100. The spin sinker 100 is disposed on the storage medium 100 in a direct contact manner. The read node 120 is positioned at the opposite side (referred to as second side) of the storage medium 100 and spaced apart from the spin sinker 110. The read node 120 is also disposed on the storage medium 100 in a direct contact manner. The storage medium 100 is composed of a single layer made of a ferromagnetic metal, a ferrimagnetic metal, or an anti-ferromagnetic metal.

The spin sinker 110 is composed of a single layer made of a ferromagnetic insulating material, a ferrimagnetic insulating material, or an anti-ferromagnetic insulating material. Specifically, the material of the storage medium 100 includes at least one of iron (Fe), cobalt (Co), nickel (Ni), boron (B), silicon (Si), zirconium (Zr), platinum (Pt), terbium (Tb), lead (Pd), copper (Cu), tungsten (W), tantalum (Ta), gadolinium (Gd), iridium (Ir), manganese (Mn), chromium (Cr), iodine (I), germanium (Ge), and tellurium (Te).

The material of the spin sinker 110 includes at least one of iron (Fe), cobalt (Co), nickel (Ni), manganese (Mn), yttrium (Y), thulium (Tm), gadolinium (Gd), europium (Eu), sulfur (S), nitrogen (N), oxygen (0), barium (Ba), chromium (Cr), germanium (Ge), and tellurium (Te). The magnetic device 130 further includes a write node (not illustrated in the drawings) disposed at the first side of the storage medium 100. The write node is in electrical contact with the storage medium 100 and is disposed under the spin sinker 110. The write node receives power from the outside of the storage medium 100 and supplies the in-plane current I to the storage medium 100.

The read node 120 includes a tunnel barrier and a ferromagnetic layer (not illustrated in the drawings) sequentially stacked on the storage medium 100. During the movement of the data structure 148 or 149 in the storage medium 100, the read node 120 electrically measures magnetoresistance corresponding to data "1" or data "0". Examples of the data structure 148 or 149 include a magnetic domain wall, a magnetic vortex, a magnetic skyrmion, and a magnetic skyrmion derivative structure. Examples of the magnetic skyrmion derivative structure include a magnetic skyrmionium and a magnetic hopfion.

Figure 5:
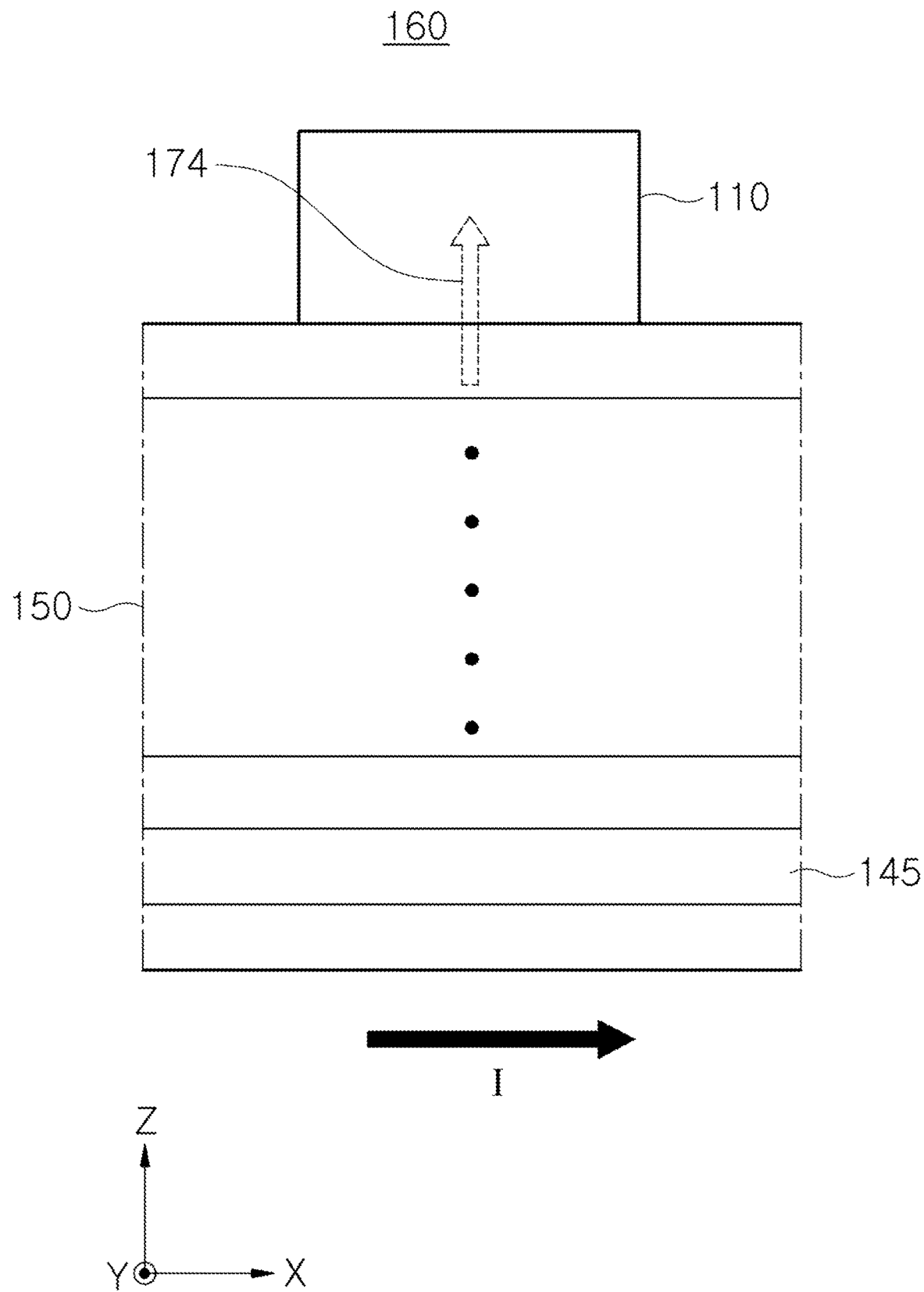
FIG. 5 is a cross-sectional view illustrating a first modification to the magnetic device illustrated in FIG. 4.

FIG. 5 is a cross-sectional view illustrating a first modification to the magnetic device illustrated in FIG. 4. In this case, a magnetic device 160 including a spin sinker has an in-plane current I and a self-generated spin current 174 that flow perpendicularly to each other in a magnetic layer 150.

Referring to FIG. 5, according to the first modification, the magnetic device 160 has a similar structure to the magnetic device 130 illustrated in FIGS. 3 and 4. However, the magnetic layer 150 of the magnetic device 160 differs from the magnetic layer 100 of the magnetic device 130 illustrated in FIG. 4. In the magnetic devices 130 and 160 each including a spin sinker, the same elements among the other elements than the magnetic layers 100 and 150 are denoted by the same reference numerals.

More specifically, the storage medium 150 is composed of a plurality of layers each of which is made of a ferromagnetic metal, a ferrimagnetic metal, or an anti-ferromagnetic metal. The spin sinker 110 is composed of a single layer made of a ferromagnetic insulating material, a ferrimagnetic insulating material, or an anti-ferromagnetic insulating material.

Figure 6:
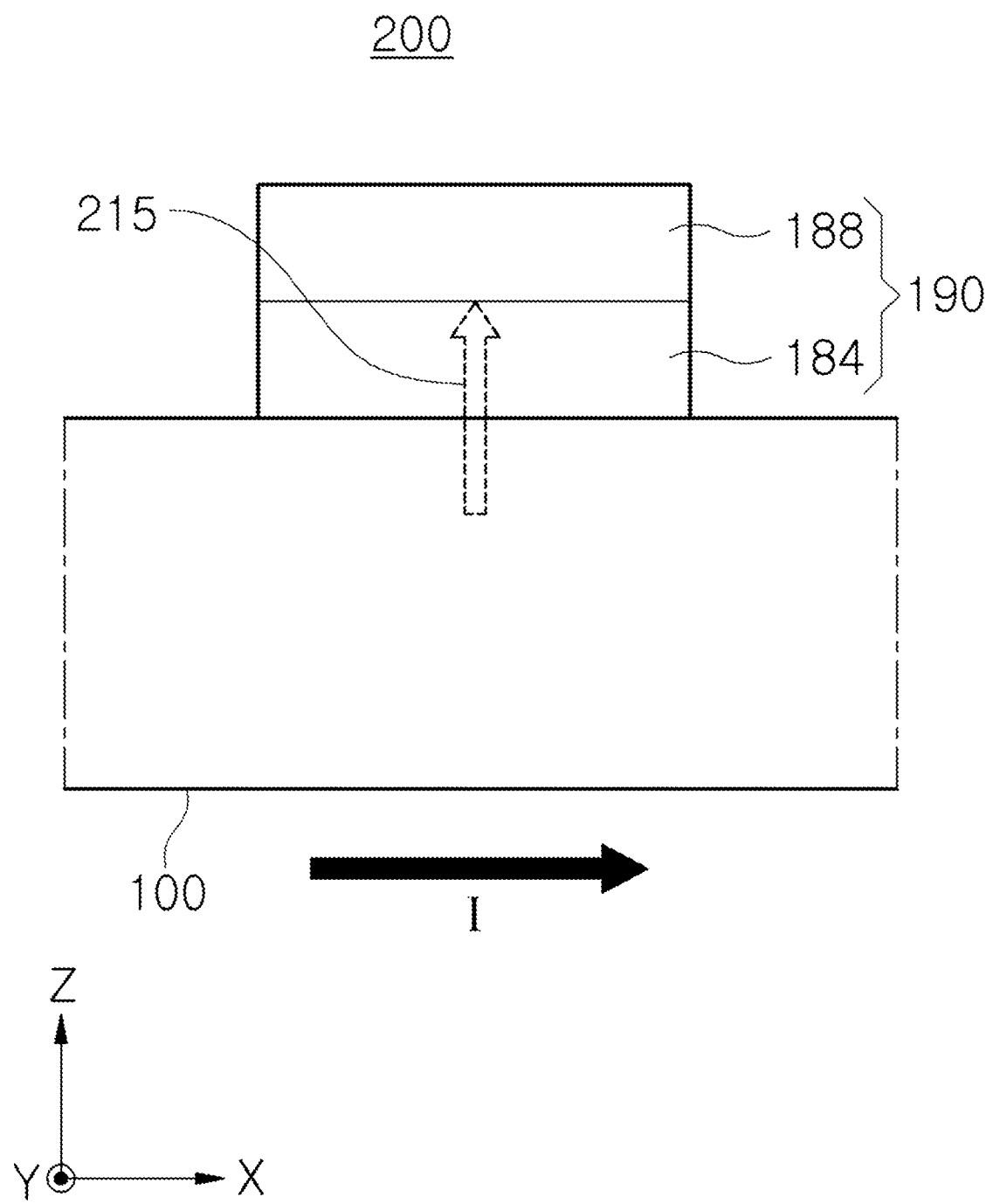
FIG. 6 is a cross-sectional view illustrating a second modification to the magnetic device illustrated in FIG. 4.

FIG. 6 is a cross-sectional view illustrating a second modification to the magnetic device illustrated in FIG. 4. In this case, a magnetic device 200 including a spin sinker has an in-plane current I and a self-generated spin current 215 that flow perpendicularly to each other in a magnetic layer 100.

Referring to FIG. 6, according to the second modification, the magnetic device 200 has a similar structure to the magnetic device 130 illustrated in FIGS. 3 and 4. However, the spin sinker 190 of the magnetic device 200 differs from the spin sinker 110 of the magnetic device 130 illustrated in FIG. 4. In the magnetic devices 130 and 200 each including a spin sinker, the same elements among the other elements than the spin sinkers 110 and 190 are denoted by the same reference numerals.

More specifically, the storage medium 100 is composed of a single layer made of a ferromagnetic metal, a ferrimagnetic metal, or an anti-ferromagnetic metal. The spin sinker 190 is composed of a plurality of layers 184 and 188 each of which is made of a ferromagnetic insulating material, a ferrimagnetic insulating material, or an anti-ferromagnetic insulating material. In this embodiment, the spin sinker 190 is composed of two layers 184 and 188. However, the spin sinker 190 can be composed of three or more layers.

Figure 7:
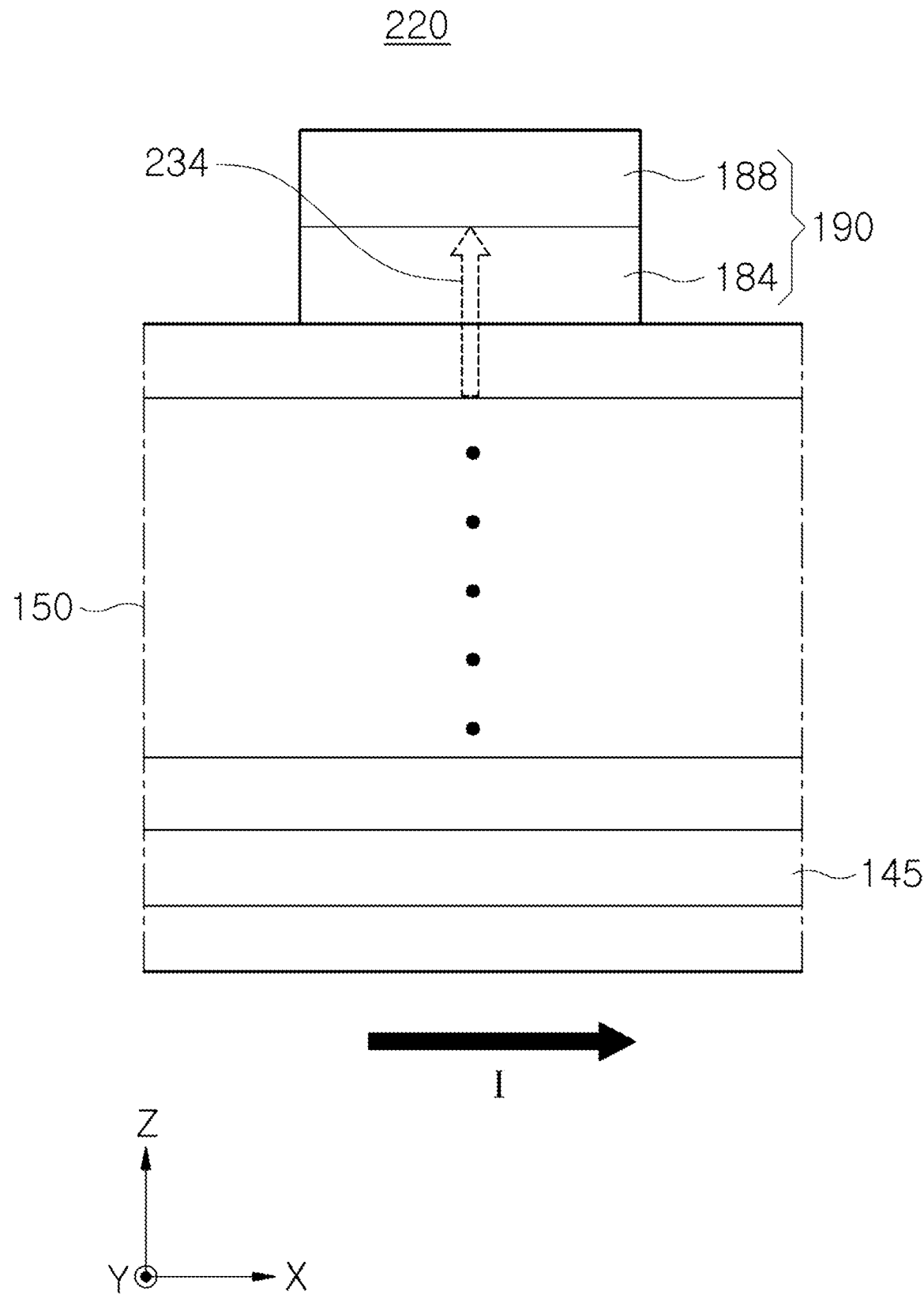
FIG. 7 is a cross-sectional view illustrating a third modification to the magnetic device illustrated in FIG. 4.

FIG. 7 is a cross-sectional view illustrating a third modification to the magnetic device illustrated in FIG. 4. In this case, a magnetic device 220 including a spin sinker has an in-plane current I and a self-generated spin current 234 that flow perpendicularly to each other in a magnetic layer 150.

Referring to FIG. 7, according to the third modification, the magnetic device 220 has a similar structure to the magnetic device 130 illustrated in FIGS. 3 and 4. However, the magnetic layer 150 and the spin sinker 190 of the magnetic device 220 differ from the magnetic layer 100 and the spin sinker 110 of the magnetic device 130 illustrated in FIG. 4, respectively. In the magnetic devices 130 and 220 each including a spin sinker, the same elements among the other elements than the magnetic layers 100 and 150 and the spin sinkers 110 and 190 are denoted by the same reference numerals.

More specifically, the storage medium 150 is composed of a plurality of layers each of which is made of a ferromagnetic metal, a ferrimagnetic metal, or an anti-ferromagnetic metal. The spin sinker 190 is composed of a plurality of layers 184 and 188 each of which is made of a ferromagnetic insulating material, a ferrimagnetic insulating material, or an anti-ferromagnetic insulating material. In this embodiment, the spin sinker 190 is composed of two layers 184 and 188. However, the spin sinker 190 can be composed of three or more layers.

Figure 8:
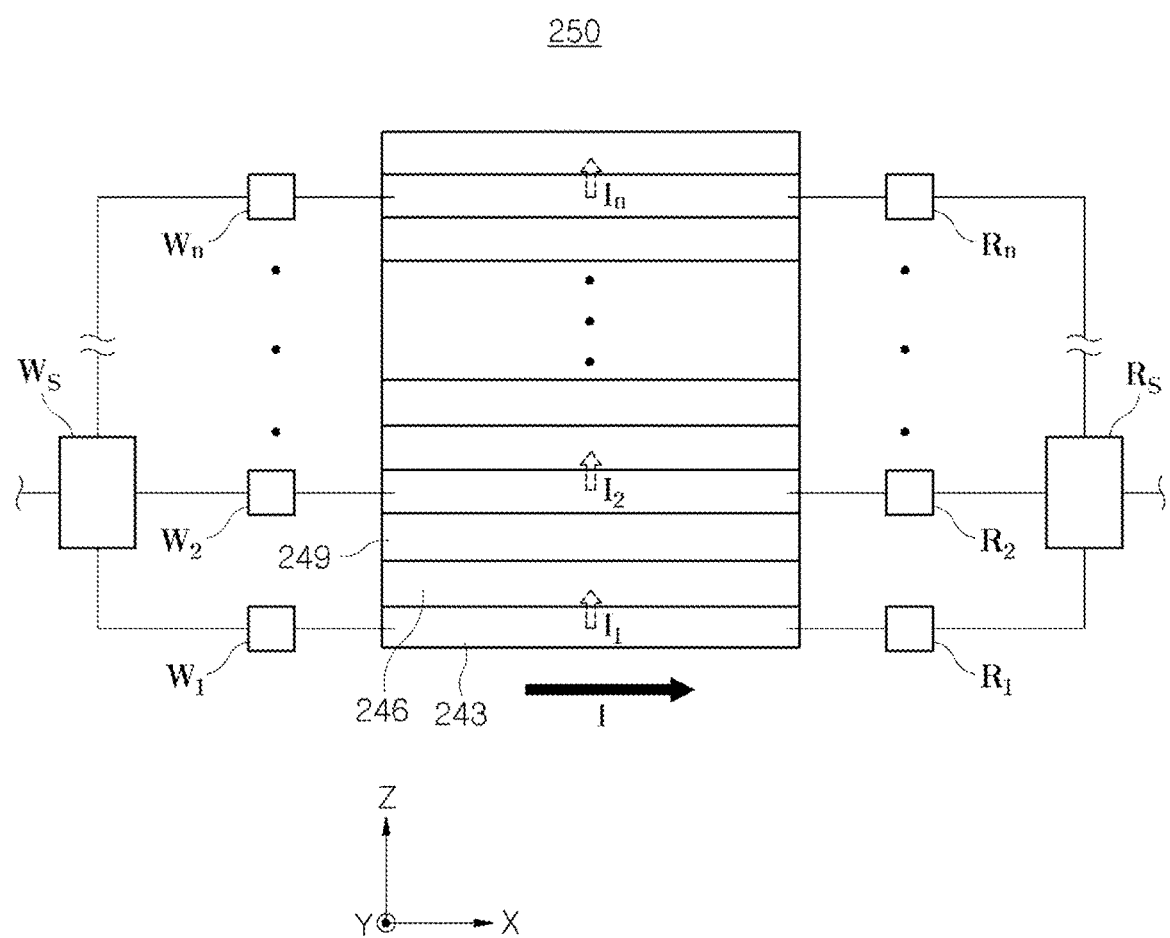
FIG. 8 is a cross-sectional view schematically illustrating a magnetic device including a spin sinker, according to a second embodiment of the present invention.

FIG. 8 is a cross-sectional view schematically illustrating a magnetic device including a spin sinker, according to a second embodiment of the present invention. In this case, a magnetic device 250 including a spin sinker has an in-plane current I and a self-generated spin current I1, or I2, . . . , or In that flow perpendicularly to each other in a magnetic layer 243.

Referring to FIG. 8, according to the second embodiment, the magnetic device 250 further includes an electrical insulator 249 disposed around a storage medium 244 and a spin sinker 248 when the spin sinker 248 is stacked on the storage medium 244. More specifically, one storage medium 243 and one spin sinker 246 constitutes a stack unit, and the magnetic device 250 includes multiple stack units that are sequentially stacked.

The insulator 249 is positioned between a lower stack unit and an upper stack unit of the stack units adjacent to each other, thereby being in direct contact with the spin sinker 246 of the lower stack unit and with the storage medium 243 of the upper stack unit. The insulator 240 prevents the self-generated spin current I1, I2, . . . , In from flowing from the spin sinker 246 of the lower stack unit to the storage medium 243 of the upper stack unit. Each of the storage medium 243 and the spin sinker 246 may include at least one layer, and the storage medium and the spin sinker may include the same number of layers.

Each of the storage medium 243 and the spin sinker 246 may include at least one layer, and may include different numbers of layers. The storage medium 243 is a ferromagnetic metal, ferrimagnetic metal, or anti-ferromagnetic metal, including at least one of Fe, Co, Ni, B, Si, Zr, Pt, Tb, Pd, Cu, W, Ta, Gd, Ir, Mn, Cr, I, Ge, and Te.

The spin sinker 246 is a ferromagnetic insulating material, ferrimagnetic insulating material, or anti-ferromagnetic insulating material, including at least one of Fe, Co, Ni, Mn, Y, Tm, Gd, Eu, S, N, O, Ba, Cr, Ge, and Te. The magnetic device 250 including a spin sinker includes a write node W1, or W2, . . . , or Wn, disposed around the storage medium 243, a write selection circuit Ws electrically connected to the write node W1, or W2, . . . , or Wn, and a read selection circuit Rs electrically connected to the read node R1, or R2, . . . , or Rn.

The write nodes W1, W2, . . . , and Wn and the read nodes R1, R2, . . . , and Rn are electrically connected to the storage media of the respective stack units 243. Each of the write nodes W1, W2, . . . , and Wn and the read nodes R1, R2, . . . , and Rn includes a switching circuit. Each of the switching circuits for the respective stack units can be individually switched on and off when a read operation or a write operation is performed on some stack units of the multiple stack units. The write nodes W1, W2, . . . , and Wn supply the in-plane current to the stack units 243, respectively.

Each of the read nodes R1, R2, . . . , and Rn includes a tunnel barrier and a ferromagnetic layer disposed around the storage medium 243 of a corresponding one of the stack units, and electrically measures magneto resistance corresponding to data "1" or data "0" from the storage medium 243 during movement of the data structure (not illustrated) in the magnetic medium 243. The write selection circuit Ws selects one of the write nodes W1, W2, . . . , and Wn corresponding to the respective stack units and supplies power to the selected write node, the read selection circuit Rs selects one of the read nodes R1, R2, . . . , and Rn corresponding to the respective stack units and supplies power to the selected read node.

Examples of the data structure (not illustrated) include a magnetic domain wall, a magnetic vortex, a magnetic skyrmion, and a magnetic skyrmion derivative structure. Examples of the magnetic skyrmion derivative structure include a magnetic skyrmionium and a magnetic hopion.

Figure 9:
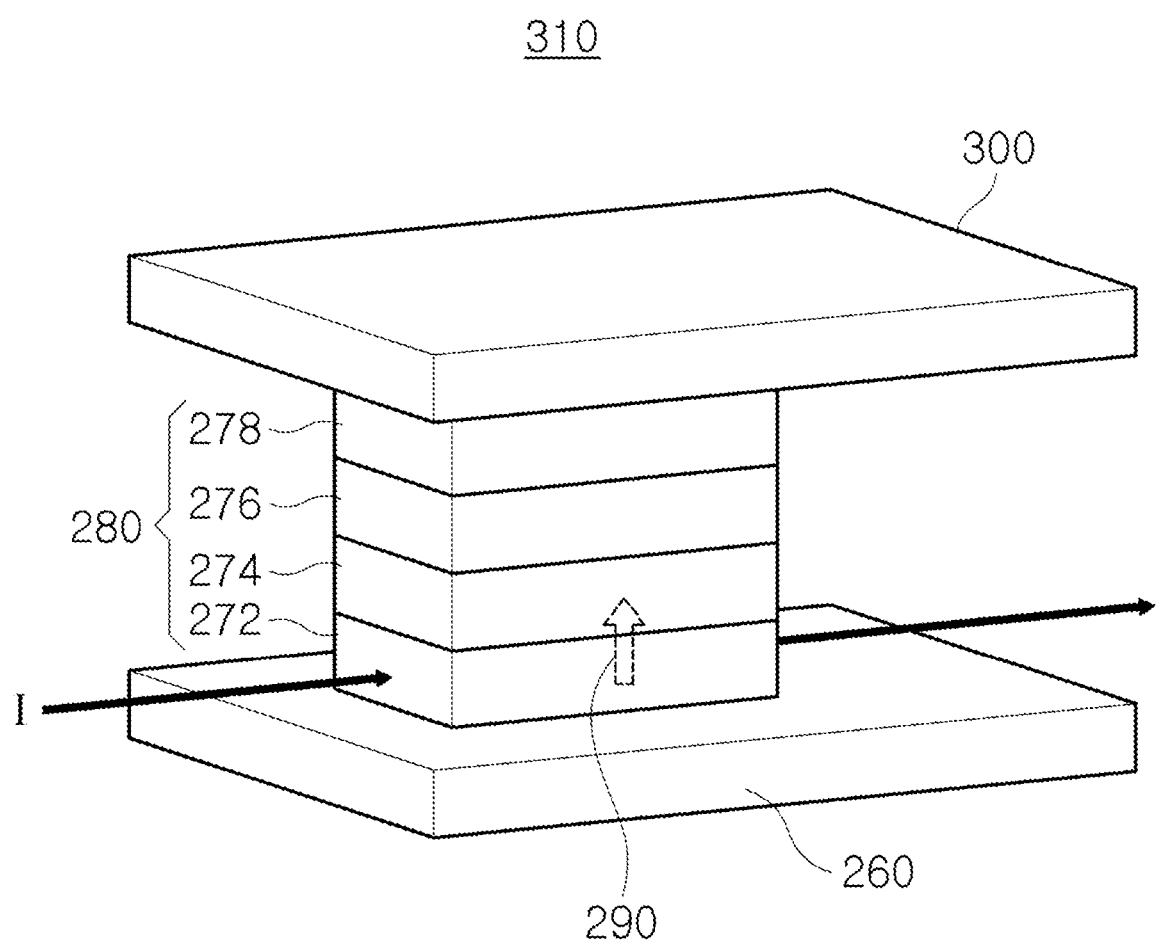
FIG. 9 is a perspective view schematically illustrating a magnetic device including a spin sinker, according to a third embodiment of the present invention.

FIG. 9 is a perspective view schematically illustrating a magnetic device including a spin sinker, according to a third embodiment of the present invention. In this case, a magnetic device 310 including a spin sinker has an in-plane current I and a self-generated spin current 290 that flow perpendicularly to each other in a magnetic layer 272.

Referring to FIG. 9, according to the third embodiment, the magnetic device 310 further includes a tunnel barrier 276 and a ferromagnetic layer 278 that are sequentially disposed on the spin sinker 274 when the storage medium 272 is stacked on the spin sinker 274. A read node is composed of a lower read node 260 disposed under the storage medium 272 and an upper read node 300 disposed on the ferromagnetic layer 278. Therefore, the read node is in direct contact with the storage medium 272 and the ferromagnetic layer 278.

The read node has the storage medium 272, the spin sinker 274, the tunnel barrier 276, and the ferromagnetic layer 278 between the lower read node 260 and the upper read node 300 as a memory cell 278. The ferromagnetic layer 278 has fixed magnetization, and the storage medium 272 has free magnetization. In addition, the magnetic device 310 including a spin sinker further includes a write node (not illustrated in the drawing) electrically connected to the storage medium 272.

The write node selectively controls a magnetization direction of the storage medium 272 by supplying an in-plane current I to the storage medium 272 by applying power to the storage medium 272. The read node electrically measures magnetoresistance corresponding to data "1" or data "0" according to whether a magnetization direction of the storage medium and a magnetization direction of the ferromagnetic layer are parallel to each other or anti-parallel to each other when the storage medium and the ferromagnetic medium are disposed between the lower read node and the upper read node.

The storage medium 272 is a ferromagnetic metal, ferrimagnetic metal, or anti-ferromagnetic metal, including at least one of Fe, Co, Ni, B, Si, Zr, Pt, Tb, Pd, Cu, W, Ta, Gd, Ir, Mn, Cr, I, Ge, and Te. The spin sinker 274 is a ferromagnetic insulating material, ferrimagnetic insulating material, or anti-ferromagnetic insulating material, including at least one of Fe, Co, Ni, Mn, Y, Tm, Gd, Eu, S, N, O, Ba, Cr, Ge, and Te. The data structure (not illustrated) is a magnetization direction of at least one of a magnetic domain and a magnetic domain wall in the storage medium 272, the magnetization direction being parallel or anti-parallel to the magnetization direction of the ferromagnetic material 278.

The magnetic device 310 including a spin sinker implements a magnetic random access memory (MRAM) based on spin orbit torque.

Figure 10:
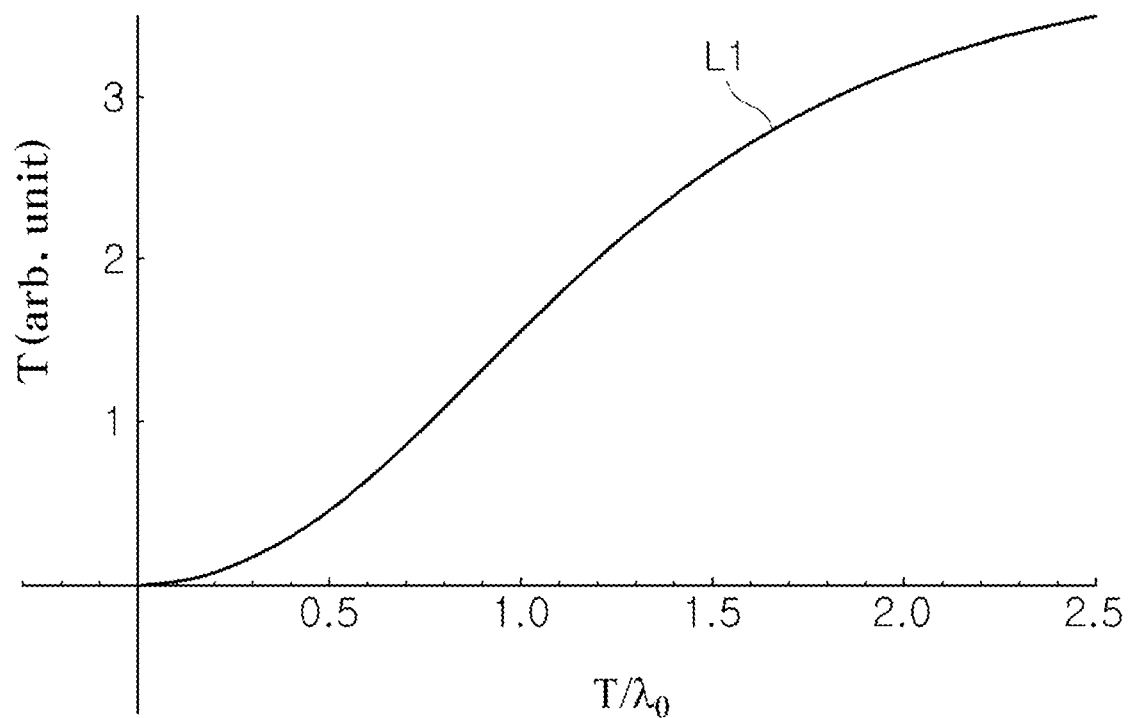
FIGS. 10 and 11 are graphs illustrating the operation characteristics of the magnetic device illustrated in FIG. 3.
Figure 11:
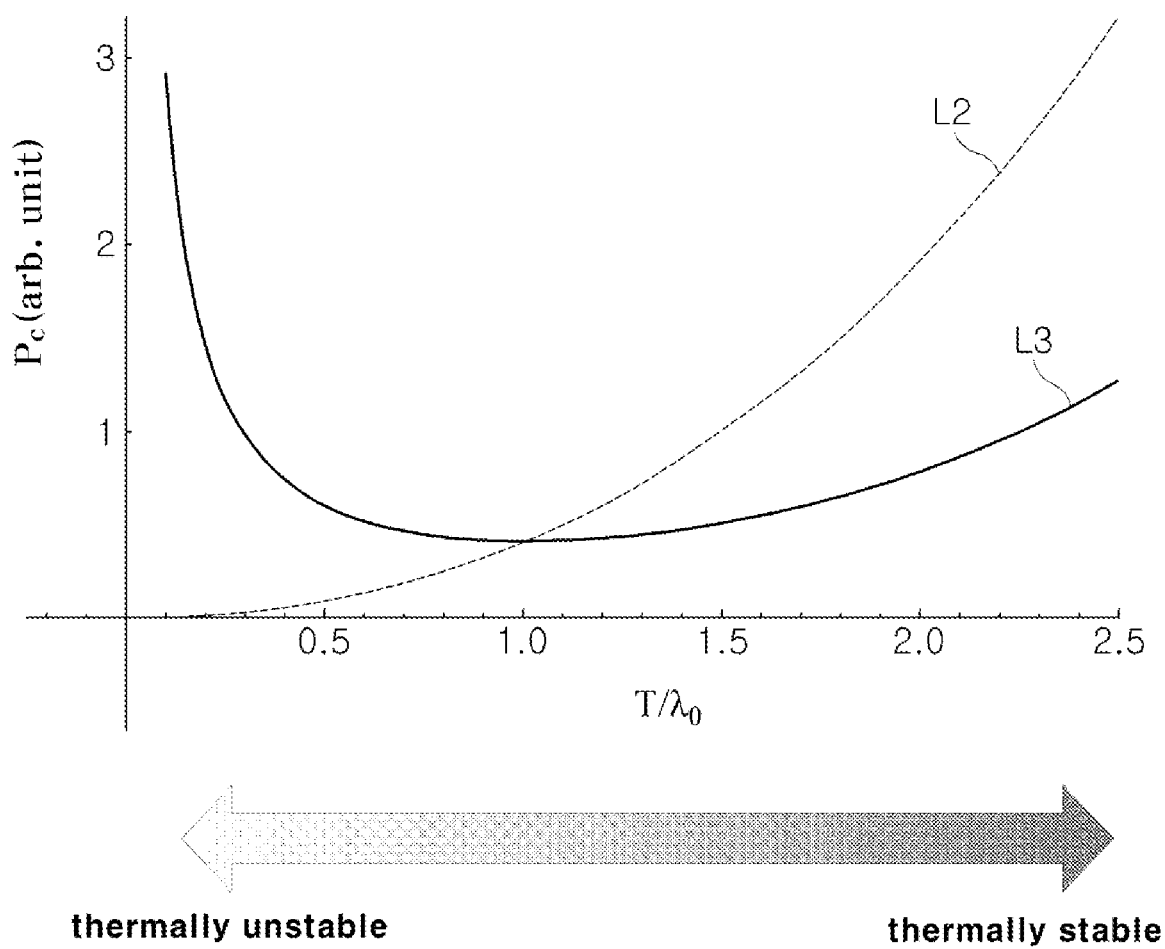

FIGS. 10 and 11 are graphs illustrating the operation characteristics of the magnetic device illustrated in FIG. 3. The operation characteristics of the magnetic device including a spin sinker will be described with reference to FIGS. 3 and 4.

Referring to FIGS. 10 and 11, a magnetic device 130 including a spin sinker is first prepared. The magnetic device 130 includes a magnetic layer 100 disposed at a lower side, and a spin sinker 110 and a read node 120 that are disposed on the magnetic layer 100. The spin sinker 110 and the read node 120 are disposed on the magnetic layer 100 and are physically spaced apart from each other.

When an in-plane current I is supplied to the magnetic layer 100, the magnetic layer 100 generates a self-generated spin current (146 in FIG. 4) perpendicular to the in-plane current I. Here, the self-generated spin current 146 is generated by self-generated spin torque in the magnetic layer 100. According to Equation 1, the self-generated spin torque is proportional to the in-plane current I supplied to the magnetic layer 100, and the moving speed of the data structure 149 in the magnetic layer 100 or the switching speed of the free magnetization direction is proportional to the self-generated spin torque.

(Equation 1)

In Equation 1, T is spin torque representing a change in time of the total magnetic moment of a magnetic layer, Re is the real part of a complex number, A is the area of the magnetic layer, $\gamma$ is the gyromagnetic ratio, $\hbar$ is the Dirac constant, jx is a current applied to the magnetic layer in x direction, e is the electron charge, t is the thickness of the magnetic layer, g1 is the efficiency at which self-generated spin current is injected into a spin sinker, $\theta$ is the spin Hall constant representing the efficiency of the self-generated spin current generated by an external electric field, $\lambda$ is a complex number where the real part of the reciprocal is the reciprocal of the attenuation length of the spin current in the magnetic layer and the imaginary part of the reciprocal is the reciprocal of the rotation length of the spin current in the magnetic layer, $\sigma$ is the electrical conductivity of the magnetic layer, g2 is efficiency at which magnon spin current in a spin sinker is injected into the magnetic layer, $\lambda_m$ is the attenuation distance of the magnon in the spin sinker, d is the thickness of the spin sinker, $\sigma_m$ is the effective conductivity of the magnon spin current in the spin sinker, m is a unit vector representing the direction of magnetization of the magnetic layer, y is a unit vector in y direction, and the coordinate direction of Equation 1 is shown in FIG. 3.

In the magnetic device 130 including a spin sinker, the self-generated spin torque was confirmed with Equation 1, which is derived by the spin diffusion equation. FIG. 10 is a graph showing the anti-damping-like component [m X (m X y)] of the spin torque, which is mainly relevant to the movement of the magnetic structure. In the graph, the X axis represents a ratio of $t/\lambda_0$ (where, t is the thickness of a magnetic layer 10), the Y axis represents T (=spin torque), the a trajectory L1 is shown between the X axis and the Y axis for g1=(e2/h)×100 nm−2, $\lambda^{-2}=(1+i)\lambda_0^{-2}$, $\sigma$=(700 nm)−1, and g2=0. Here, $\lambda_0$ is a constant representing the spin attenuation length and the spin rotation length. Even when $\lambda_0$ is set to any arbitrary value, it is the same value throughout the graph, and is generally known as a size of several nm to several tens of nm.

Figure 1:
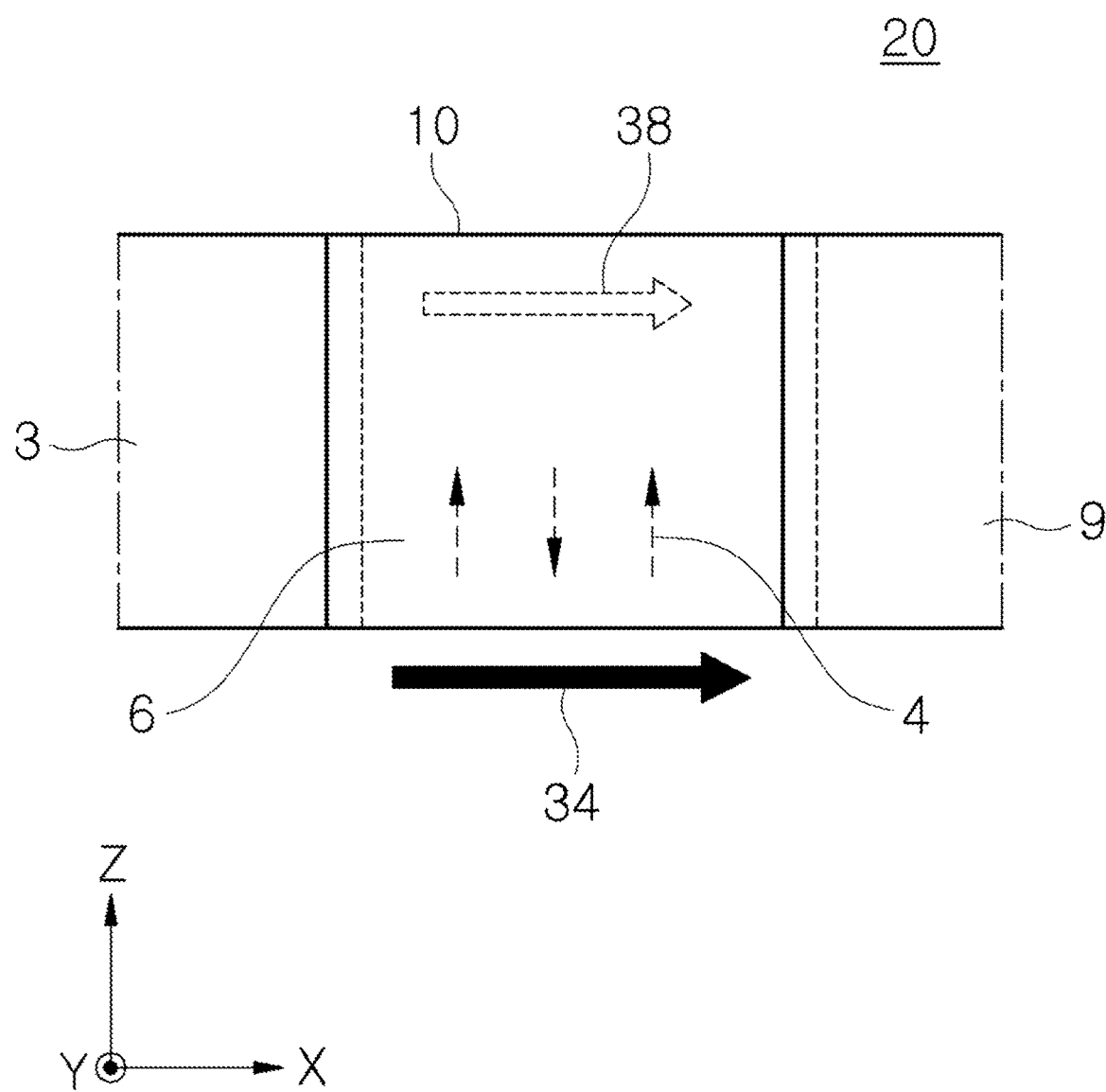
FIG. 1 is a cross-sectional view schematically illustrating a racetrack device based on spin transfer torque.
Figure 2:
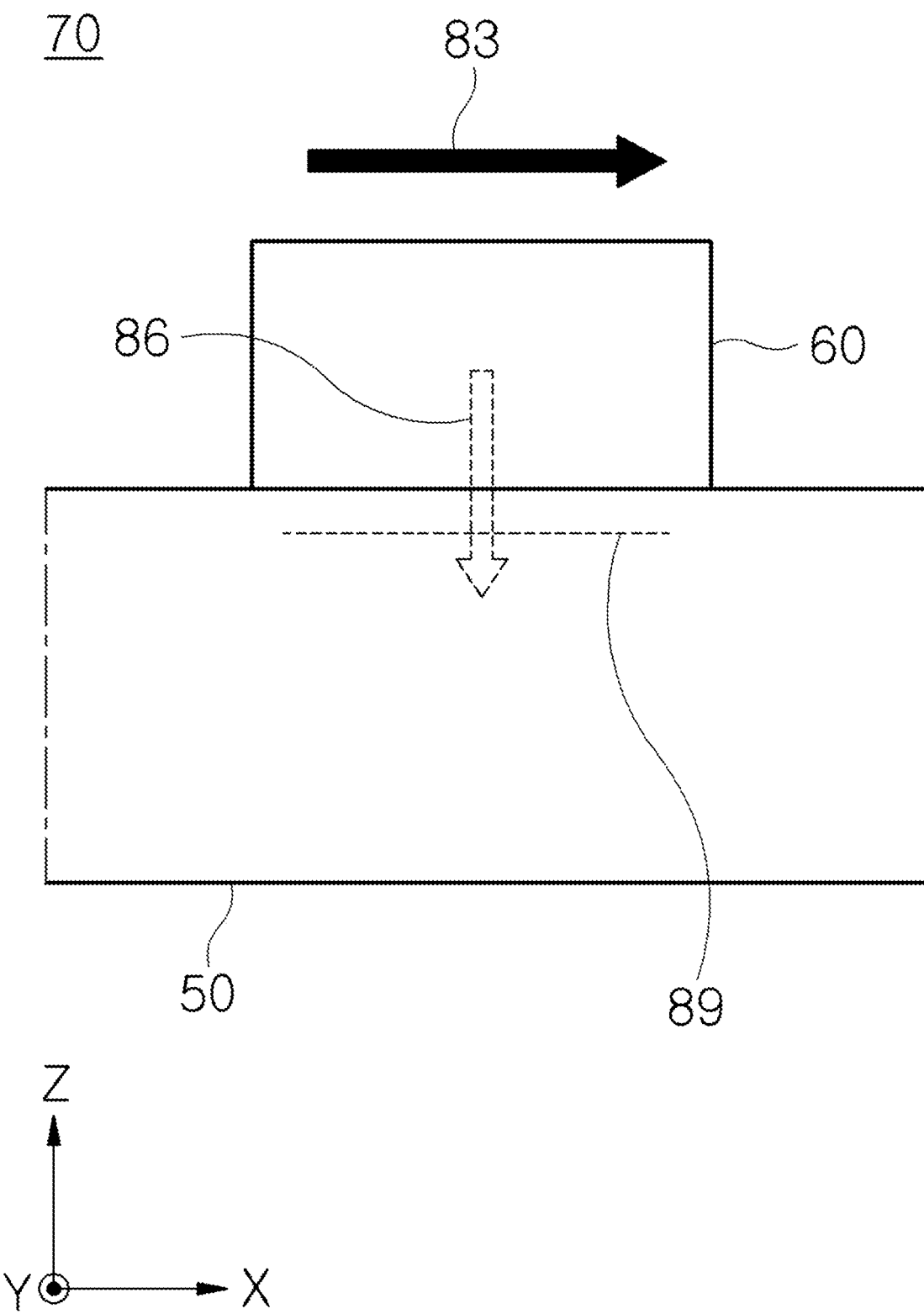
FIG. 2 is a cross-sectional view schematically illustrating a racetrack device based on spin orbit torque.

As illustrated in FIGS. 1 and 2, in the racetrack device 20 based on the spin transfer torque or the racetrack device 70 based on the spin orbit torque according to the related art, considering the direction of flow of the spin hall current 86, the efficiency of the spin torque, is in inverse proportion to the thickness of the magnetic layer 10 or 50. That is, the efficiency of the spin torque is reduced as the thickness of the magnetic layer 10 or 50 is increased for thermal stability of the magnetic layer 10 or 50.

However, in the magnetic device 130 including a spin sinker, according to the present invention, considering the direction of flow direction of the self-generated spin current 146, the efficiency of the self-generated spin torque increases with an increase in the thickness of the magnetic layer 100. Therefore, the magnetic device 130 according to the present invention is more thermally stable than the conventional racetrack devices 20 and 70 that are respectively based on spin transfer torque and spin orbit torque in terms of the same spin torque efficiency.

On the other hand, according to Physical Review B 99, 220405(R)(2019), since the amount of the self-generated spin current 146 is on the same order of magnitude of the spin current 86 generated from the heavy metal 60 of the spin orbit torque-based racetrack device 70 illustrated in FIG. 2, the self-generated spin torque is almost the same in magnitude as the spin orbit torque generated by the heavy metal 60 of the spin orbit torque-based racetrack device 70.

However, the magnetic device 130 including a spin sinker has an advantage of generating a large spin torque even when a magnetic insulator 110 instead of the heavy metal 60 is adjacent to the magnetic layer 100. In addition, in the magnetic device 130 including a spin sinker, the self-generated spin current 146 flows in the Z direction as illustrated in FIG. 4 and is absorbed by the spin sinker 120 made of a magnetic insulating material.

That is, when the spin sinker 110 is disposed on the magnetic layer 100, the self-generated spin current 146 is a current converted from the in-plane current I in the magnetic layer 100. The self-generated spin current 146 is injected into the spin sinker 110 and is naturally attenuated by the magnon. In contrast, the in-plane current I does not flow through the spin sinker 120. In addition, matters disclosed in the graph of FIG. 10 are confirmed through the driving power of the data structure 149 according to the thickness of the magnetic layer 100.

That is, the minimum current density for driving the data structure can be calculated under the condition that the value of T/t calculated from the above equation must be above the minimum value. In addition, the minimum current density makes it possible to derive the minimum current value Ic for driving the data structure. Through this, in the magnetic device 130, the minimum power value required for driving the data structure is calculated as Pc=Ic2R where the resistance R of the magnetic layer 100 is inversely proportional to the thickness t of the magnetic layer 100.

In FIG. 11, the X axis represents t/λ0 where t is the thickness of the magnetic layer 100, the Y axis represents Pc which is the minimum power value, and trajectories L2 and L3 are shown between the X axis and the Y axis. The trajectory L2 is a trace of the minimum power value Pc according to the thickness t of the magnetic layer 50 in the spin torque of the spin orbit torque-based racetrack device 70 illustrated in FIG. 2, and the trajectory L3 is a trace of the minimum power value Pc according to the thickness t of the magnetic layer 100 in the self-generated spin torque of the magnetic device 130 including a spin sinker.

In the spin orbit torque-based racetrack device 70, the spin torque T is independent of the thickness t of the magnetic layer 50, and the minimum power value Pc of the spin orbit torque-based racetrack device 70 can be derived from the above equation under the condition in which the area through which the spin Hall current flows is proportional to the sum of the thickness t of the magnetic layer 50 and the thickness d of the heavy metal 60.

As a whole, in the graph of FIG. 11, the thickness d of the heavy metal was fixed to 5 nm. Since a detailed proportional constant depends on material constants, in order to compare the thickness dependence between different structures, the minimum power value Pc was determined under a condition of t=λ0 where t is the thickness of the magnetic layer 50 or 100 and is within the thickness range of a conventional magnetic layer. Comparing the trajectories L2 and L3 of the graph of FIG. 11, for a typical thickness range, the magnetic device 130 including a spin sinker increases much more gradually in the minimum power value Pc than the conventional spin orbit torque-based racetrack device 70, according to an increase in the thickness of the magnetic layer.

More specifically, assuming the magnetic layer 50 or 100 has the same minimum power value Pc at the thickness t=λ0, it was confirmed that the magnetic device 130 including a spin sinker could drive the data structure 149 with a minimum power value Pc which is reduced by 60.4% compared to that of the spin orbit torque-based racetrack device 70 at the thickness t=2.41λ0. However, those skilled in the art will appreciate that the numerical values shown above are only examples for describing the advantages of the present invention and may vary according to specific material constants and structures.

What is claimed is:

1. A magnetic device including a spin sinker, the magnetic device comprising:
a storage medium that receives an in-plane current from the outside thereof and generates a self-generated spin current that flows perpendicularly to a charge current that is the in-plane current and controls a data structure with the self-generated spin current;
a spin sinker that receives the self-generated spin current from the storage medium and attenuates the self-generated spin current; and
a read node that measures a magnetoresistance of the data structure through the storage medium,
wherein the storage medium is made of a magnetic metal,
the spin sink is made of a magnetic insulating material, and
the read node reads data "1" or data "0" according to a presence type of the structure or according to presence or absence of the data structure in the storage medium.

2. The magnetic device according to claim 1, wherein the spin sink is disposed on the storage medium in a manner that the spin sink is in direct contact with the storage medium, and
the read node is disposed under the storage medium in a manner that the read node is in direct contact with the storage medium.

3. The magnetic device according to claim 2, wherein the storage medium comprises a single layer made of a ferromagnetic metal, a ferrimagnetic metal, or an antiferromagnetic metal, and
the spin sinker comprises a single layer made of a ferromagnetic insulating material, a ferrimagnetic insulating material, or an anti-ferromagnetic insulating material.

4. The magnetic device according to claim 2, wherein the storage medium comprises a plurality of layers each of which is made of a ferromagnetic metal, a ferrimagnetic metal, or an anti-ferromagnetic metal, and
the spin sinker comprises a single layer made of a ferromagnetic insulating material, a ferrimagnetic insulating material, or an anti-ferromagnetic insulating material.

5. The magnetic device according to claim 2, wherein the storage medium comprises a single layer made of a ferromagnetic metal, a ferrimagnetic metal, or an anti-ferromagnetic metal, and
the spin sinker comprises a plurality of layers each of which is made of a ferromagnetic insulating material, a ferrimagnetic insulating material, or an anti-ferromagnetic insulating material.

6. The magnetic device according to claim 2, wherein the storage medium comprises a plurality of layers each of which is made of a ferromagnetic metal, a ferrimagnetic metal, or an anti-ferromagnetic metal, and
the spin sinker comprises a plurality of layers each of which is made of a ferromagnetic insulating material, a ferrimagnetic insulating material, or an anti-ferromagnetic insulating material.

7. The magnetic device according to claim 2, wherein the storage medium comprises at least one of Fe, Co, Ni, B, Si, Zr, Pt, Tb, Pd, Cu, W, Ta, Gd, Ir, Mn, Cr, I, Ge, and Te, and
the spin sinker comprises at least one of Fe, Co, Ni, Mn, Y, Tm, Gd, Eu, S, N, O, Ba, Cr, Ge, and Te.

8. The magnetic device according to claim 2, further comprising a write node that is disposed on one side of the storage medium and under the spin sinker and is in electrical contact with the storage medium,
wherein the write node receives power from the outside of the storage medium and supplies the in-plane current to the storage medium.

9. The magnetic device according to claim 2, wherein the read node comprises a tunnel barrier and a ferromagnetic layer sequentially stacked on the storage medium and electrically measures the magnetoresistance corresponding to data "1" or data "0" at a position directly under the read node during movement of the data structure in the storage medium.

10. The magnetic device according to claim 2, wherein the data structure comprises a magnetic domain wall, a magnetic vortex, a magnetic skyrmion, or a magnetic skyrmion derivative structure, and
the magnetic skyrmion derivative structure comprises a magnetic skyrmionium or a magnetic hopfion.

11. The magnetic device according to claim 1, further comprising an electrical insulator disposed around the storage medium and the spin sinker when the spin sinker is stacked on the storage medium,
wherein the storage medium and the spin sinker that are stacked constitutes a stack unit, and
the electrical insulator is positioned between a lower stack unit and an upper stack unit of the stack units adjacent to each other and is thus in direct contact with the spin sinker of the lower stack unit and with the storage medium of the upper stack unit, and
the electrical insulator prevents the self-generated spin current from flowing from the spin sinker of the lower stack unit to the storage medium of the upper stack unit.

12. The magnetic device according to claim 11, wherein each of the storage medium and the spin sinker comprises at least one layer, and the storage medium and the spin sinker comprise the same number of layers.

13. The magnetic device according to claim 11, wherein each of the storage medium and the spin sinker comprises at least one layer, and the storage medium and the spin sinker comprise different number of layers.

14. The magnetic device according to claim 11, wherein the storage medium is made of a ferromagnetic metal, ferrimagnetic metal, or anti-ferromagnetic metal, including at least one of Fe, Co, Ni, B, Si, Zr, Pt, Tb, Pd, Cu, W, Ta, Gd, Ir, Mn, Cr, I, Ge, and Te, and
the spin sinker is made of a ferromagnetic insulating material, ferrimagnetic insulating material, or anti-ferromagnetic insulating material, including at least one of Fe, Co, Ni, Mn, Y, Tm, Gd, Eu, S, N, O, Ba, Cr, Ge, and Te.

15. The magnetic device according to claim 11, further comprising:
a write node positioned around the storage medium;
a write selection circuit electrically connected to the write node; and
a read selection circuit electrically connected to the read node,
wherein each of the write node and the read node is electrically connected to the storage medium of each of the stack units and comprises a switching circuit for each of the stack units, and the switching circuits for the respective stack units can be individually switched on and off when a read operation or a write operation is performed on the storage medium of each of the stack units.

16. The magnetic device according to claim 15, wherein the write node supplies the in-plane current to the storage medium for each stack unit, and
the read node comprises a tunnel barrier and a ferromagnetic layer disposed around the storage medium of each of the stack units, and the read node electrically measures a magnetoresistance corresponding to the data "1" or the data "0" from the storage medium during movement of the data structure in the storage medium.

17. The magnetic device according to claim 15, wherein the write selection circuit and the read selection circuit selects the write node for each of the stack units and the read node for each of the stack units and supplies power to the write node for each of the stack units and the read node for each of the stack units.

18. The magnetic device according to claim 11, wherein the data structure comprises a magnetic domain wall, a magnetic vortex, a magnetic skyrmion, or a magnetic skyrmion derivative structure, and
the magnetic skyrmion derivative structure comprises a magnetic skyrmionium or a magnetic hopfion.

19. The magnetic device according to claim 1, further comprising a tunnel carrier and a ferromagnetic material sequentially positioned on the spin sinker while the storage medium and the spin sinker are sequentially stacked,
the read node comprises a lower read node disposed under the storage medium and an upper read node disposed on the ferromagnetic layer, thereby being in direct contact with the storage medium and the ferromagnetic layer,
the read node has the storage medium, the spin sinker, the tunnel barrier, and the ferromagnetic body disposed between the upper read node and the lower read node as a memory cell,
the ferromagnetic layer has a fixed magnetization, and
the storage medium has a free magnetization.

20. The magnetic device according to claim 19, further comprising a write node that is electrically connected to the storage medium, and
wherein the write node supplies the in-plane current to the storage medium by supplying power to the storage medium, and
the read node electrically measures a magnetoresistance corresponding to data "1" or data "0" according to whether a magnetization direction of the storage medium and a magnetization direction of the ferromagnetic layer are parallel to each other or anti-parallel to each other when the storage medium and the ferromagnetic medium are disposed between the lower read node and the upper read node.

21. The magnetic device according to claim 19, wherein the storage medium is made of a ferromagnetic metal, ferrimagnetic metal, or anti-ferromagnetic metal, including at least one of, Fe, Co, Ni, B, Si, Zr, Pt, Tb, Pd, Cu, W, Ta, Gd, Ir, Mn, Cr, I, Ge, and Te, and
the spin sinker is made of a ferromagnetic insulating material, ferrimagnetic insulating material, or anti-ferromagnetic insulating material, including at least one of, Fe, Co, Ni, Mn, Y, Tm, Gd, Eu, S, N, O, Ba, Cr, Ge, and Te.

22. The magnetic device according to claim 19, wherein the data structure is a magnetization direction of the storage medium, which is parallel to or anti-parallel to a magnetization direction of the ferromagnetic layer.

* * * * *